United States Patent [19]
Kaufman et al.

[11] Patent Number: 6,060,949
[45] Date of Patent: May 9, 2000

[54] HIGH EFFICIENCY SWITCHED GAIN POWER AMPLIFIER

[75] Inventors: Ralph Kaufman, La Mesa; Darin Hunzeker; Richard J. Camarillo, both of San Diego, all of Calif.

[73] Assignee: Qualcomm Incorporated, San Diego, Calif.

[21] Appl. No.: 09/158,456

[22] Filed: Sep. 22, 1998

[51] Int. Cl.[7] ................................... H03F 3/68
[52] U.S. Cl. ........................... 330/51; 330/124 R
[58] Field of Search ........................ 330/51, 124 R, 330/124 D, 129

[56] References Cited

U.S. PATENT DOCUMENTS

| | | | |
|---|---|---|---|
| 5,423,074 | 6/1995 | Dent | 455/74 |
| 5,661,434 | 8/1997 | Brozovich et al. | 330/51 |
| 5,793,253 | 8/1998 | Kumar et al. | 330/124 R |
| 5,872,481 | 2/1999 | Sevic et al. | 330/51 |
| 5,909,643 | 6/1999 | Aihara | 330/51 |

*Primary Examiner*—Robert Pascal
*Assistant Examiner*—Khanh Van Nguyen
*Attorney, Agent, or Firm*—Philip R. Wadsworth; Charles D. Brown

[57] ABSTRACT

A power amplifier circuit arrangement including a power amplifier, and a bypass network for bypassing an RF-input signal around the power amplifier when excess gain and output power are not needed. When the bypass network is used, the power amplifier is turned off. A circulator connects the bypass network to the power amplifier output, thus removing the requirement of an output switch. The RF-input signal enters the circulator which routes the signal toward the output of the power amplifier. Because the amplifier is off, its output appears as a high impedance and reflects the signal back to the circulator. The circulator routes the reflected signal the signal output.

13 Claims, 7 Drawing Sheets

HIGH EFFICIENCY SWITCHED GAIN POWER AMPLIFIER

BACKGROUND INFORMATION

I. Field of the Invention

The present invention relates generally to power gain control for a power amplifier and particularly to a wireless communication device, such as a CDMA wireless phone.

II. Description of the Related Art

In many electronic environments, such as most hand-held communication systems including code-division-multiple-access (CDMA) or any form of time-division-multiple access (TDMA) technology, RF power output from a mobile unit varies in large dynamic ranges. In a CDMA radiotelephone system, multiple signals are transmitted simultaneously at the same frequency. The signals are spread with different digital codes, thus allowing detection of the desired signal while the unintended signals appear as noise or interference to the receiver. Spread spectrum systems can tolerate some interference, and the interference added by each new mobile station increases the overall interference in each cell site. Each mobile station introduces a unique level of interference, which depends on its received power level at the cell site.

The CDMA system uses power control to minimize mutual interference. A precise power control is critical to avoid excessive transmitter signal power that is responsible for contributing to the overall interference of the system. Power of the individual mobile stations varies with the distance between the mobile station and the base station and the number of other subscriber mobile stations in that base station or sector.

In a typical hand-held wireless unit, the power amplifier is biased class AB to reduce power consumption during periods of low transmit power, but power continues to be consumed. Typically an isolator is used to isolate the power amplifier from the effects of load impedance in subsequent stages. One method to avoid continuous battery draw is to employ a means to bypass the amplifier with switches, and then remove DC power from the Amplifier. This method is illustrated in FIG. 7. A power amplifier circuit 8 is shown with a power amplifier 32 and an isolator 55. An RF input 12 having an RF-signal to be amplified is connected to a pole of a first switch 20. When the amplifier is on, the switch 20 connects the RF-input 12, via path 28, to an input of power amplifier 32. The RF-signal is amplified and output to the isolator 55, and then transmitted through the second switch 42 to the RF-output 54 of the power amplifier circuit 8. To bypass the power amplifier 32, the first switch 20 connects the RF-input 12 to the bypass path 30 and the second switch 42 transmits the signal to the RF-output 54. The drawback of this technique is that the amplifier must overcome the added switching loss during times that higher transmit power is required. This can tend to cancel the benefits of bypassing. Furthermore, using a switch and an isolator requires more power to operate and is more costly to build.

FIG. 6 illustrates a prior art power amplifier circuit. An analog signal is fed from a driver amplifier 280 through a band pass filter 298 to a first switch 20. The switch 20 alternates between a bypass path 30 and an amplifier path 28, wherein a power amplifier 32 amplifies the signal. A second switch 42 connects the analog signal from either the bypass path 30 or the output of amplifier 32 to a circulator 55, which routes the signal to the RF-output port 54.

SUMMARY OF THE INVENTION

What is needed in the art is a power amplifier circuit which conserves more power and which is less complex and expensive to build by making better use of the isolator, thereby allowing removal of a second switch located after the power amplifier.

An object of the present invention is to increase the efficiency of power amplifier usage by using the termination port of an isolator as the combining mechanism for the bypass network, the power amplifier output, and the RF-output port. With this configuration, an output switch becomes unnecessary.

Another object of the present invention is to provide an improved power amplifier which requires less parts and is less complex to build.

Yet another object of the present invention is to provide an improved power amplifier which is less costly to build.

These objects and others may be realized by the invention disclosed herein. In a power amplifier circuit, a bypass network is provided to bypass the power amplifier in the circuit when the amplifier gain is not required. During these periods of low power operation, the amplifier is turned off. The bypass network consists of a bypass path, and an attenuation path. The attenuation path allows variability through use of an external resistor, and the bypass path allows no variability. Switches operate to control the flow of the signal to the amplifier, or through either the bypass path or the attenuation path. The signal from the bypass network is input to a circulator, which routes the signal to the port connected to the output of the power amplifier. Because the power amplifier is turned off during periods when the bypass is used, it appears to be a very large impedance to the signal. Most of the input power signal is reflected back to the circulator for a normal exit from the RF-out port. An external resistor is used in conjunction with the attenuated path to provide flexibility in the available gain steps.

In another aspect of the present invention, the band pass filter is placed in the amplification path such that filtering is bypassed when the power amplifier is bypassed. This reduces the gain step size when changing modes from amplification to bypass. The driver amplifier therefore becomes the output amplifier and the filter following the amplifier circuitry operates to remove any undesired spurs.

In another aspect of the present invention, when bypassing the power amplifier, it becomes possible to drive the driver amplifier harder and thus provide greater flexibility in choosing gain steps.

BRIEF DESCRIPTION OF THE DRAWINGS

The features and advantages of the present invention will become more apparent from the detailed description set forth below when taken in conjunction with the drawings in which like reference characters correspond throughout and wherein.

DETAILED DESCRIPTION OF THE INVENTION

Figure 1:
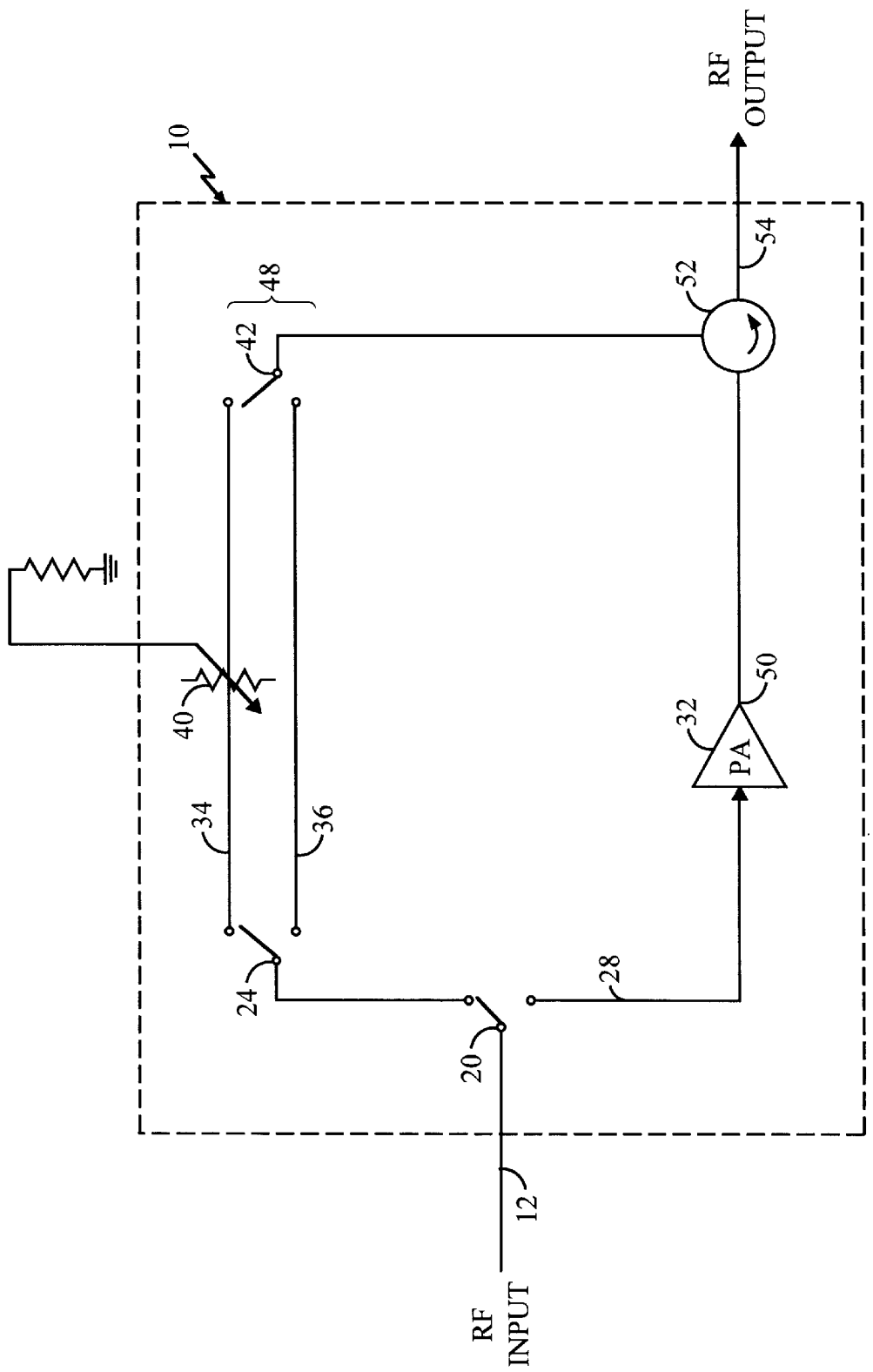
FIG. 1 is a plan drawing of the first embodiment of the present invention.

FIG. 1 is a schematic diagram showing the broad concept of the invention. A power amplifier circuit, indicated generally by reference numeral 10 comprises a power amplifier 32, a circulator 52, a series of switches, 20, 24 and 42, and bypass paths 34 and 36 around the power amplifier 32. An RF-input 12 having an RF-signal to be amplified is connected to a pole of first switch 20. When the power amplifier is turned on and power amplification is required, the switch 20 connects the RF-input 12, via a path 28, to an input of power amplifier 32. The RF-signal is amplified and output from the power amplifier toward the circulator 52. The circulator 52 routes the signal to port of the RF-output 54 of power amplifier circuit 10.

When the power amplifier is not needed and turned off, the switch 20 switches the signal path to a bypass network 48 comprising a bypass path 36 and an attenuated path 34. To send the signal through the bypass path 36, switches 24 and 42 switch to a first position such that the signal flows through bypass path 36. Switches 24 and 42 can also switch the signal to flow through the attenuated path 34. From switch 42 the signal is transmitted to an input of circulator 52. The circulator 52 routes the signal to the port connected to the output 50 of the power amplifier 32. The output of the power amplifier 50 appears as a high impedance to the signal and thus the signal is reflected back to the circulator 52, which routes the signal to the port of the RF-output 54 of amplifier circuit 10.

Figure 2:
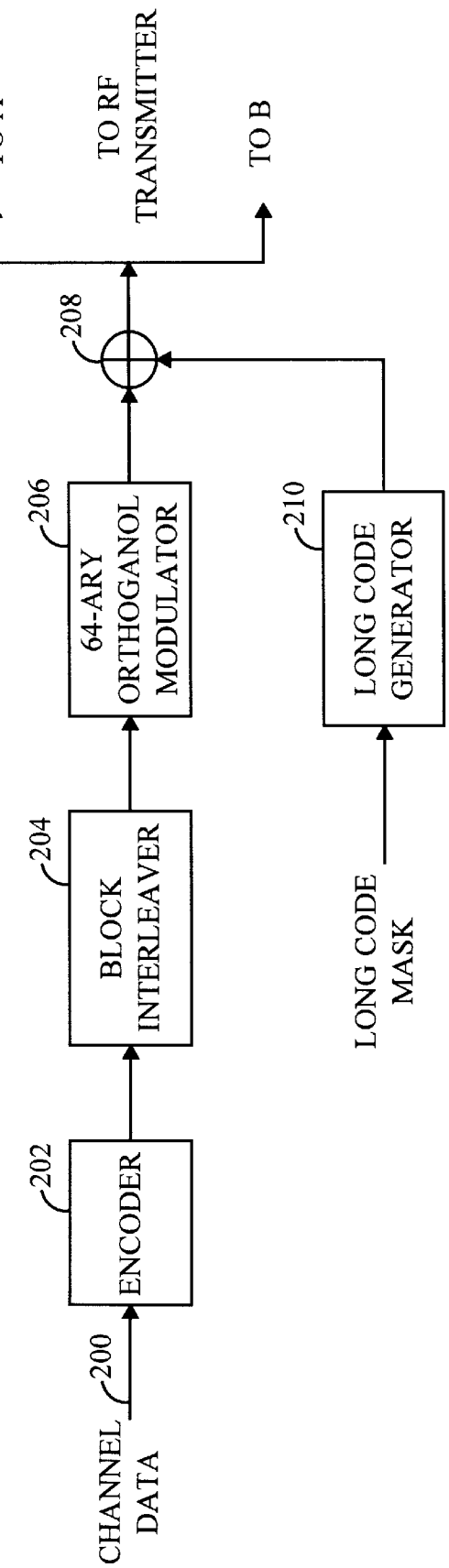
FIG. 2 provides a block diagrammatic representation of a mobile station spread spectrum transmitter in which may be incorporated an efficient power amplifier of the present invention.

FIG. 2 is a schematic diagram illustrating the use of the power amplifier of the present invention in the signal processing circuitry of a mobile station. In an exemplary CDMA system, orthogonal signaling is employed to provide a suitable ratio of signal to noise on the mobile station-to-base station link, or the "reverse" channel. Data bits 200 consisting of, for example, voice converted to data by a vocoder, are supplied to an encoder 202 where the bits are convolutionally encoded. When the data bit rate is less than the bit processing rate of the encoder 202, code symbol repetition may be used such that the encoder 202 repeats the input data bits 200 in order to create a repetitive data stream at a bit rate which matches the operative rate of the encoder 202. In an exemplary embodiment the encoder 202 receives data bits 200 at a nominal bit rate ($R_b$) of 11.6 kbits/second, and produced $R_b/r$=34.8 symbols/second, where "r" denotes the code rate (e.g. ⅓) of the encoder 202. The encoded data is then provided to block interleaver 204 where it is block interleaved.

With the 64-ary orthogonal modulator 206, the symbols are grouped into characters containing $\log_2 64$=6 symbols at a rate of $(1/r)(R_b/\log_2 64)$=5,800 characters/second, with there being 64 possible characters. In a preferred embodiment each character is encoded into a Walsh sequence of length 64. That is, each Walsh sequence includes 64 binary bits or "chips", there being a set of 64 Walsh codes of length 64. The 64 orthogonal codes correspond to Walsh codes from a 64 by 64 Hadamard matrix wherein a Walsh code is a single row or column of the matrix.

The Walsh sequence produced by the modulator 206 is provided to an exclusive-OR combiner 208, where it is then "covered" or multiplied at a combiner with a PN code specific to a particular mobile station. Such a "long" PN code is generated at a rate $R_c$ by a PN long code generator 210 in accordance with a user PN long code mask. In an exemplary embodiment the long code generator 210 operates at an exemplary chip rate, $R_c$, of 1.2288 Mhz so as to produce four PN chips per Walsh chip. The output of the exclusive-OR combiner 208 is split into identical signals A and B. Signals A and B are input into the exclusive-OR combiners 256 and 254 of FIG. 3 as described below.

Figure 3:
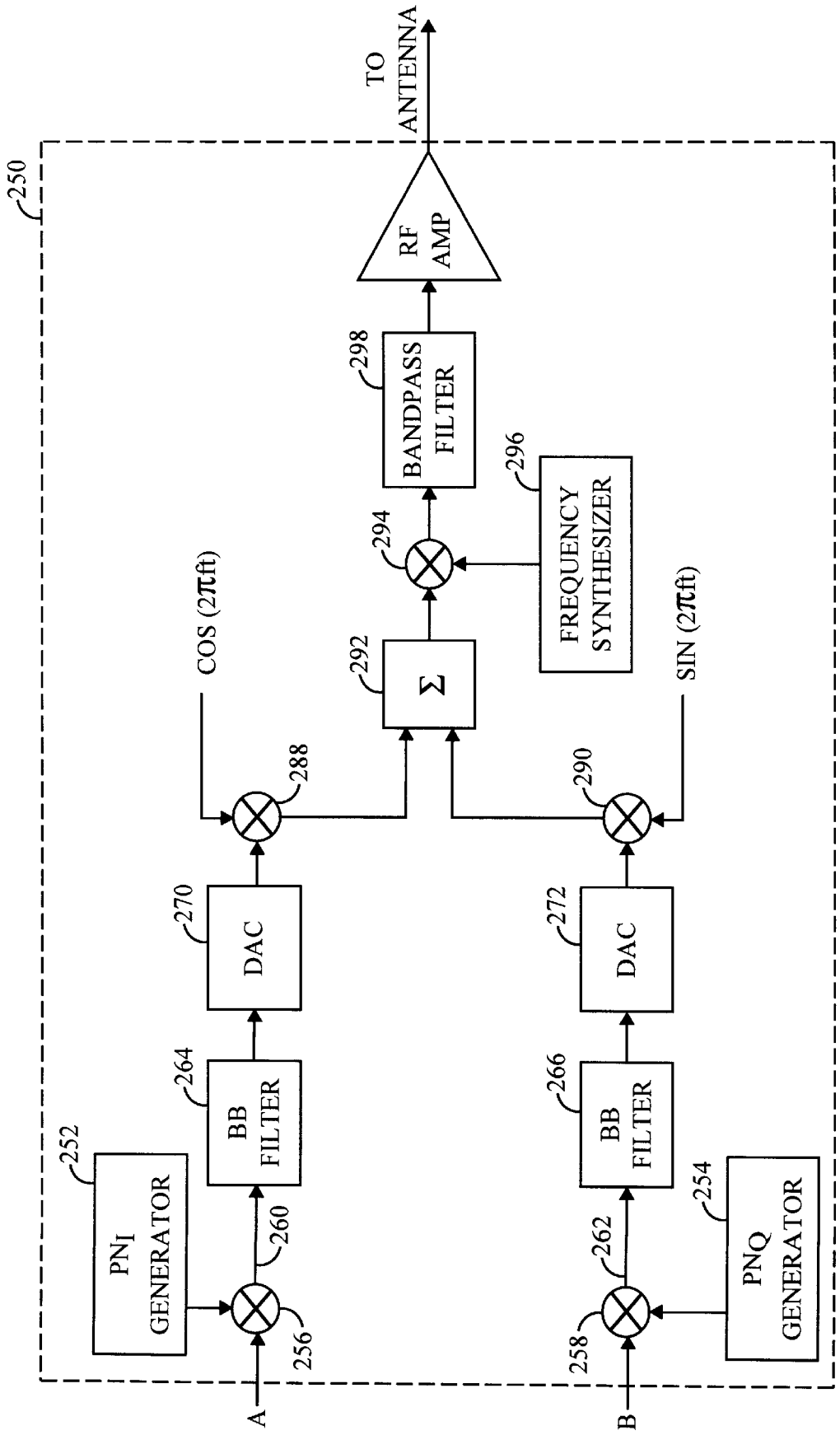
FIG. 3 shows an exemplary implementation of an RF transmitter included within the spread spectrum transmitter of FIG. 2.

FIG. 3 is a schematic diagram showing an exemplary implementation of the RF transmitter 250 in a mobile station. In CDMA spread spectrum applications, a pair of short PN sequences, $PN_I$ and $PN_Q$, are respectively provided by a $PN_I$ generator 252 and a $PN_Q$ generator 254 to exclusive-OR combiners 256 and 258, along with the output A and B from exclusive-OR combiner 208 of FIG. 2. The $PN_I$ and $PN_Q$ sequences relate respectively to in phase (I) and quadrature phase (Q) communication channels, and are generally of a length (32,768 chips) much shorter than the length of each user long PN code. The resulting I-channel code spread sequence 260 and Q-channel code spread sequence 262 are then passed through baseband filters 264 and 266, respectively.

Digital to Analog (D/A) converters 270 and 272 are provided for converting the digital I-channel and Q-channel information, respectively, into analog form. The analog waveforms produced by D/A converters 270 and 272 are provided with a local oscillator (LO) carrier frequency signals Cos (2 πft) and Sin (2 πft), respectively, to mixers 288 and 290 where they are mixed and provided to summer 292. The quadrature phase carrier signals Sin (2 πft) and Cos (2 πft) are provided from suitable frequency sources (not shown). These mixed IF signals are summed in summer 292 and provided to mixer 294.

Figure 4:
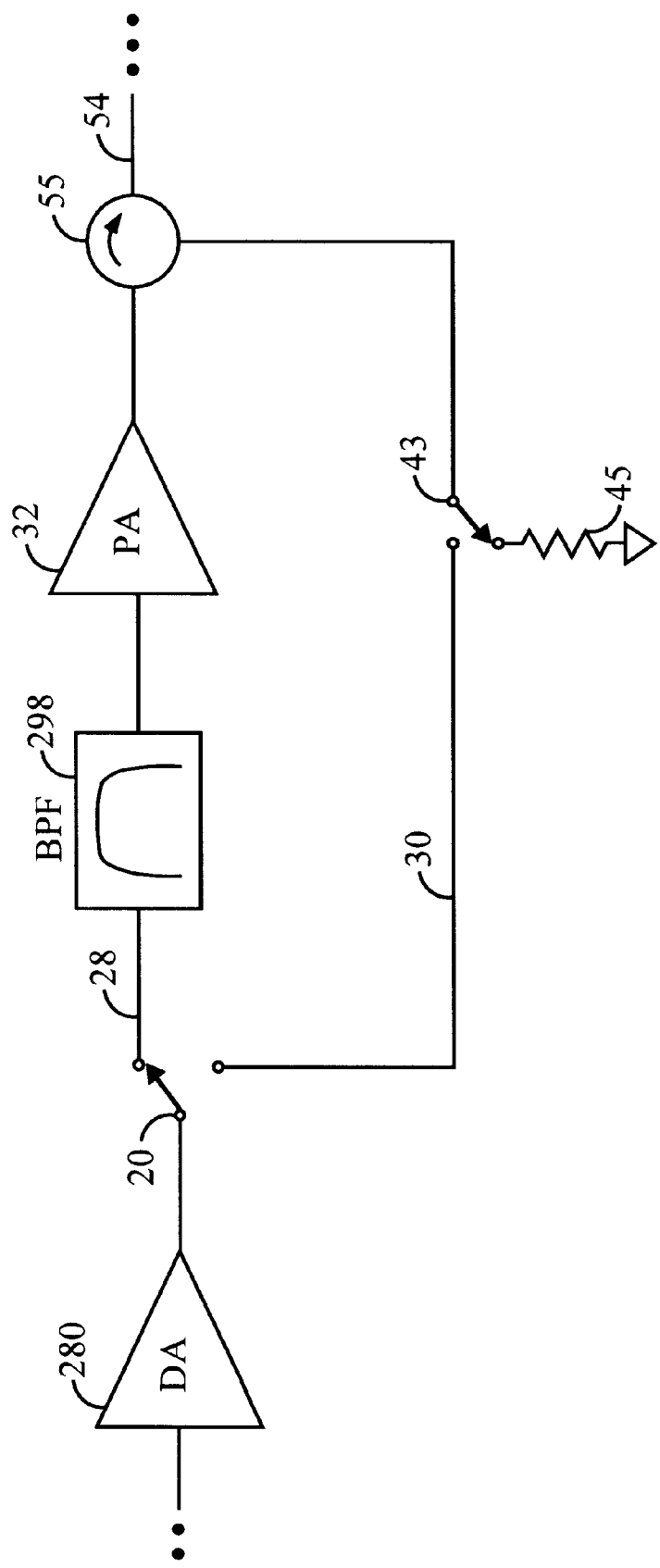
FIG. 4 is a plan drawing of a second embodiment of the present invention.
Figure 5:
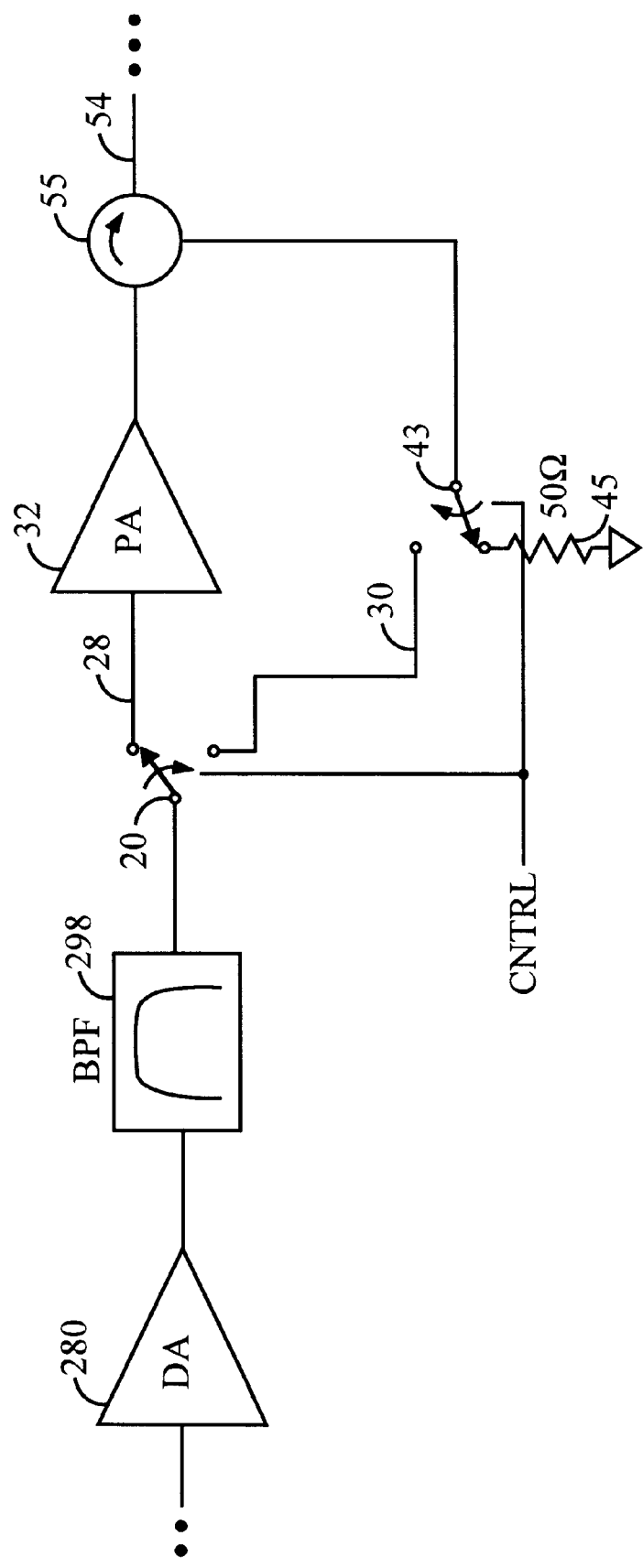
FIG. 5 is a plan drawing of a third embodiment of the present invention.
Figure 6:
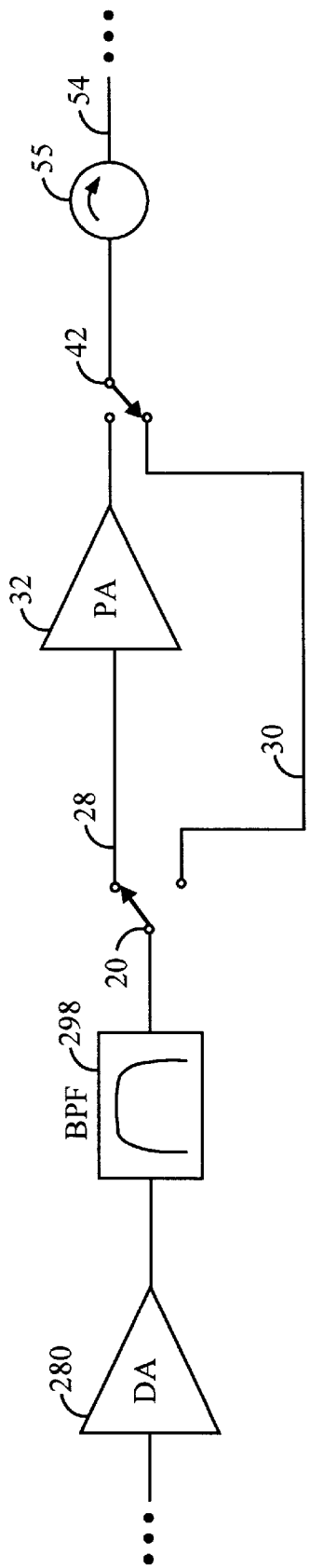
FIG. 6 is a plan drawing of a prior art amplifier circuit.
Figure 7:
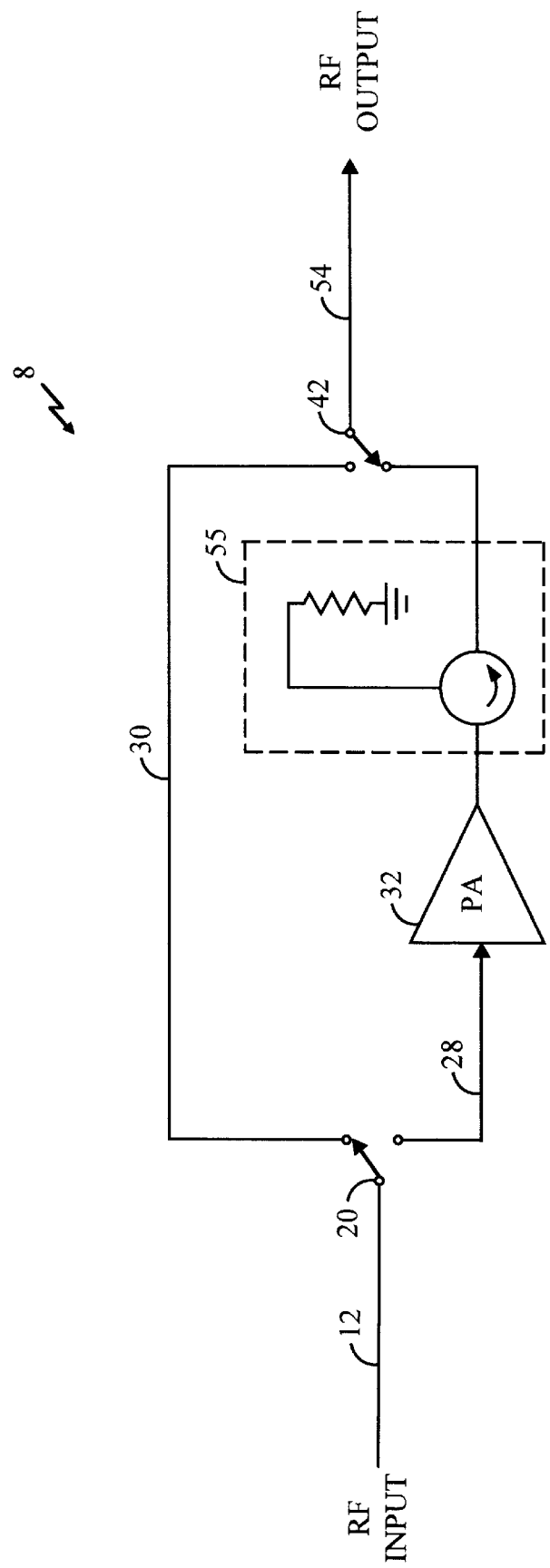
FIG. 7 is a plan drawing of a prior art power amplifier circuit.

Mixer 294 mixes the summed signal with an RF frequency from frequency synthesizer 296 so as to provide frequency upconversion to the RF frequency band. The RF may then be bandpass filtered 298 and provided to an efficient parallel stage RF amplifier 10 of the invention. The filter 298 removes undesired spurs caused from upconversion 296. A similar filter (not shown) may be located following the amplifier circuitry to remove undesired spurs when the circuit is operating in bypass mode. In a bypass mode, the previous driver amplifier becomes the output amplifier and filtering may be necessary to prevent extra spurs from mixing in the non-linearities of the amplifier. This filtering may be accomplished by the similar filter (not shown), thus the band-pass filter 298 may be located in the amplification path as illustrated in FIGS. 4 and 5 discussed below. This also increases flexibility in choosing gain steps.

FIG. 4 is a second embodiment of the present invention wherein the analog signal is switched 20 between a bypass path 30 and an amplifier path 28. However, band-pass filtering 298 only occurs in the amplifier path 28. Accordingly, the signal is band-pass filtered 298 and fed to the power amplifier 32, amplified, and transmitted to the circulator 55, which routes the signal towards the RF-output port 54. The circulator 55 is connected to ground through a switch 43 and a resistor 45 and the output port 54 of the circuit when the first switch 20 directs the analog signal through the amplifier path. Accordingly, with this configuration, when reflected or returned RF signals enter the circulator 55 from the direction of the RF-output port 54, the reflected signal is routed by the circulator 55 to ground. When the first switch 20 switches the analog signal to the bypass path 30, the second switch 43 connects the bypass path 30 to the circulator 55, and the signal is routed toward the output of the amplifier. This will appear as a high impedance, reflecting the signal back through isolator 55 and to RF-output port 54.

When high output power is not needed, the power amplifier 32 is turned off and the first switch 20 switches to the bypass path 30, whereby the power amplifier 32 is bypassed and the driver amplifier 280 operates as the power amplifier. The second switch 43 connects the bypass path 30 to the circulator 55. The input signal in this mode is routed through the bypass path 30 to the circulator 55. The signal is routed by the circulator to the output of the power amplifier 32, and is reflected back through the isolator 55 and to the output of the RF-output port 54.

FIG. 5 shows a third embodiment of the present invention having a driver amplifier 280 and a band-pass filter 298 for filtering the amplified signal before a first switch 20. The output from the band pass filter 298 is switched by the first switch 20 which switches between an amplifier path 28 and a bypass path 30. The power amplifier 32 in the amplifier path amplifies and transmits the signal to a circulator 55, which routes the signal towards an RF-output port 54. The first switch 20 alternates between transmitting the filtered signal to the amplifier path 28 or the bypass path 30. A second switch 43 in the bypass path is included which connects the circulator 55 to ground through a resistor 45 in a first mode, and connects the circulator 55 to the bypass path 30 in a second mode. The resistor 45 may have a value of 50 ohms, for example.

Any feedback or return signal from the RF-output port 54 is routed to ground when the second switch 43 is in the second mode. When in the first mode switch 20 transmits the signal to the bypass path 30, switch 43 transmits the signal from the bypass path 30 to the circulator 55. The circulator 55 routes the signal to the output of the power amplifier, which appears to be a large impedance and reflects most of the signal back to the circulator 55. The signal is then routed toward the RF-output port 54. Accordingly, the switch 43 adds isolation due to the fact that the signal cannot be switched to an attenuation path. This embodiment is applicable when only one gain step is desired.

The previous description of the preferred embodiments is provided to enable any person skilled in the art to make or use the present invention. Various modifications to the embodiments will be readily apparent to those skilled in the art, and the generic principles defined herein may be applied to other embodiments without the use of the inventive faculty. Thus, the present invention is not intended to be limited to the embodiments shown herein, but is to be accorded the widest scope consistent with the principles and novel features disclosed herein.

What is claimed is:

1. A power amplifier circuit arrangement, comprising:
    a power amplifier having an input and an output;
    an RF-input port;
    an RF-output port;
    means for bypassing the power amplifier through a bypass network;
    first means for switching an RF-signal from the RF-input port between the bypass network and the input to the amplifier;
    said bypass network comprising a bypass path and an attenuated path and second means for switching between the bypass path and the attenuated path; and
    a circulator connecting the bypass network, the output of the power amplifier, and the RF-output port, whereby the RF-signal inputted from the bypass network to the circulator is routed to the output of the power amplifier and the RF-signal inputted into the circulator from the power amplifier output is routed to the RF-output port.

2. The power amplifier circuit of claim 1 wherein when the power amplifier is powered off, the first means for switching switches the RF-signal to the bypass network such that the RF-signal bypasses the power amplifier, routes through the circulator towards the power amplifier output, is reflected by the power amplifier, and routes through the circulator to the RF-output port.

3. The power amplifier circuit of claim 1 wherein the attenuated path includes an external resistor connected to ground to allow flexibility in providing gain steps.

4. The power amplifier circuit of claim 1 wherein when the power amplifier is powered off and the first means for switching connects the RF-input port to the bypass network, and when the first means for switching switches to the bypass path, the RF-signal passes through the bypass path, routes through the circulator toward the output of the power amplifier, is reflected by the power amplifier and routes through the circulator to the RF-output port.

5. The power amplifier circuit of claim 1 wherein when the power amplifier is powered off and the first means for switching connects the RF-input port to the bypass network, and when the second means for switching switches to the attenuated path, the RF-signal passes through the attenuated path, routes through the circulator toward the power amplifier output, is reflected by the power amplifier and routes through the circulator to the RF-output port.

6. The power amplifier circuit of claim 3, wherein when the power amplifier is powered on, and the first means for switching connects the RF-input port to the input of the power amplifier, the second means for switching switches the attenuated path to the circulator to maximize reverse isolation and protect against oscillation.

7. The power amplifier circuit of claim 3, wherein the external resistor is a variable resister for gain adjustment.

8. A power amplifier circuit arrangement, comprising:
    a driver amplifier for transmitting an RF analog signal;
    first means for switching said RF analog signal between a bypass path and an amplifier path;
    a band pass filter positioned in said amplifier path which filters said RF analog signal and produces a filtered signal;
    a power amplifier positioned in said amplifier path which amplifies said filtered signal to produce an amplified signal;
    a circulator which routes said amplified signal to an RF-output port;
    said bypass path connecting an output of said driver amplifier to said circulator when said first means for switching switches to said bypass path, wherein said bypass path connects to said circulator such that said RF analog signal input to said circulator from said bypass path is routed to said power amplifier;
    second means for switching positioned in said bypass path and switching a connection to said circulator between said bypass path and ground through a resistor, whereby, when said second means for switching connects to ground, power returned to the circuit from the direction of the RF-output port is routed to ground to isolate said power amplifier circuit arrangement.

9. The power amplifier circuit arrangement of claim 8, wherein said first means for switching switches to said bypass path the power amplifier is turned off.

10. A power amplifier circuit arrangement, comprising:
    a driver amplifier for transmitting an RF analog signal;
    a band pass filter positioned for filtering said RF analog signal and produces a filtered signal;

first means for switching said filtered signal between a bypass path and an amplifier path;

a power amplifier positioned in said amplifier path which amplifies said filtered signal to produce an amplified signal;

a circulator which routes said amplified signal to an RF-output port;

said bypass path connecting an output of said band pass filter to said circulator when said first means for switching switches to said bypass path, wherein said bypass path connects to said circulator such that said filtered signal input to said circulator from said bypass path is routed to said power amplifier;

second means for switching positioned in said bypass path and switching a connection to said circulator between said bypass path and ground through a resistor, whereby, when said second means for switching connects to ground, power returned to the circuit from the direction of the RF-output port is routed to ground to isolate said power amplifier circuit arrangement.

11. The power amplifier circuit arrangement of claim 10, further comprising means for controlling said first and said means for switching.

12. The power amplifier circuit arrangement of claim 10, wherein said resistor is approximately 50 ohms.

13. The power amplifier circuit arrangement of claim 10, wherein said first means for switching switches to said bypass path the power amplifier is turned off.

* * * * *